United States Patent
Shin et al.

(10) Patent No.: US 12,156,456 B2
(45) Date of Patent: Nov. 26, 2024

(54) LIGHT EMITTING DISPLAY PANEL AND LIGHT EMITTING DISPLAY DEVICE INCLUDING THE SAME

(71) Applicant: LG Display Co., Ltd., Seoul (KR)

(72) Inventors: Youngsub Shin, Paju-si (KR); DaeHeung Lee, Paju-si (KR); JuHyuk Kim, Paju-si (KR); Byonghoo Kim, Paju-si (KR); Aram Sohn, Paju-si (KR); Sungjin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 448 days.

(21) Appl. No.: 17/525,695

(22) Filed: Nov. 12, 2021

(65) Prior Publication Data

US 2022/0165812 A1 May 26, 2022

(30) Foreign Application Priority Data

Nov. 20, 2020 (KR) .................... 10-2020-0156408

(51) Int. Cl.
| | |
|---|---|
| *H10K 59/50* | (2023.01) |
| *H10K 50/86* | (2023.01) |
| *H10K 59/122* | (2023.01) |
| *H10K 59/38* | (2023.01) |

(52) U.S. Cl.
CPC ........... *H10K 59/50* (2023.02); *H10K 50/865* (2023.02); *H10K 59/122* (2023.02); *H10K 59/38* (2023.02); *G02F 2202/14* (2013.01)

(58) Field of Classification Search
CPC .... H10K 59/50; H10K 50/865; H10K 59/122; H10K 59/38; H10K 59/35; H10K 59/12; H10K 50/86; H10K 50/818; H10K 50/8426; G02F 2202/14; G02B 5/201
See application file for complete search history.

(56) References Cited

U.S. PATENT DOCUMENTS

| | | | |
|---|---|---|---|
| 2018/0095190 A1 | 4/2018 | Frease et al. | |
| 2018/0097045 A1* | 4/2018 | Maeda | ................... H10K 71/00 |

(Continued)

FOREIGN PATENT DOCUMENTS

| | | | | |
|---|---|---|---|---|
| CN | 111403462 A | * | 7/2020 | ........... H01L 27/322 |
| EP | 2202820 A1 | | 6/2010 | |

(Continued)

OTHER PUBLICATIONS

English Machine Translation of WO2012 161 060 Itoh et al (Year: 2024).*

(Continued)

*Primary Examiner* — Donald L Raleigh
(74) *Attorney, Agent, or Firm* — Seed IP Law Group LLP

(57) ABSTRACT

A light emitting display panel includes a first emission area, a second emission area, and a third emission area spaced apart from each other and emitting different colors of light and a photochromic layer surrounding each of the first, second, and third emission areas and disposed in a non-emission area. When the first emission area, the second emission area, and the third emission area emit light, the photochromic layer is in a transparent state. When light of a wavelength band shorter than visible light is incident on the photochromic layer, the photochromic layer is in an opaque state.

25 Claims, 13 Drawing Sheets

(56) References Cited

U.S. PATENT DOCUMENTS

2018/0269260 A1* 9/2018 Ghosh .................... H10K 59/50
2019/0318688 A1   10/2019 Kondo et al.

FOREIGN PATENT DOCUMENTS

TW         201107827 A  *  3/2011   ........... G02F 1/1333
WO    WO-2012161060 A1  * 11/2012   ............. G02B 5/201

OTHER PUBLICATIONS

English Machine Translation of TW 201107827 Ou et al (Year: 2024).*
English Machine Translation of CN 111 403 462 Zhang et al (Year: 2024).*
Irie et al., "Photochromism of Diarylethene Molecules and Crystals: Memories, Switches, and Actuators," *Chemical Reviews*, vol. 114(24):12174-12176, May 19, 2014. (3 pages).

\* cited by examiner

⟨ OFF ⟩

LIGHT EMITTING DISPLAY PANEL AND LIGHT EMITTING DISPLAY DEVICE INCLUDING THE SAME

CROSS-REFERENCE TO RELATED APPLICATION

This application claims priority from Korean Patent Application No. 10-2020-0156408, filed on Nov. 20, 2020, which is hereby incorporated by reference for all purposes as if fully set forth herein.

BACKGROUND

Technical Field

Embodiments of the disclosure relate to a light emitting display panel and a light emitting display device including the same, such as an organic light emitting display panel and an organic light emitting display device including the same.

Description of the Related Art

A display device is an output device for presentation of information in visual and plays a key role in the information age. Display devices are evolving to deliver a higher performance while being slimmer, lighter, and portable. Among flat panel displays which are much lighter and less bulky than cathode-ray tubes (CRTs), an organic light emitting display (OLED) device gains popularity that displays images by controlling the amount of light emitted by a light emitting layer.

An OLED display device includes polarizing plates including a circularly polarizing plate and a linearly polarizing plate, through which it implements true black and reduces external light reflection to enhance visibility.

However, OLED display devices adopting a polarizing plate have issues with increase in cost and reduction in brightness.

BRIEF SUMMARY

Embodiments of the disclosure relate to a light emitting display panel with improved field-of-view (FOV) structure and a light emitting display device including the same.

Embodiments of the disclosure relate to a light emitting display panel with reduced external light reflectance and improved color characteristics and a polarizing plate-free light emitting display device including the same.

Embodiments of the disclosure relate to a light emitting display panel, which has a structure capable of preventing a color mix of the light emitted from different emission areas even without a black matrix and a light emitting display device including the same.

According to embodiments of the disclosure, there may be provided a light emitting display panel and a light emitting display device including the same, comprising a substrate, a first electrode disposed on the substrate, a bank overlapping a portion of an upper surface of the first electrode, a light emitting layer disposed on the first electrode, a second electrode disposed on the light emitting layer, an encapsulation layer disposed on the substrate having the second electrode, a photochromic layer disposed on the encapsulation layer, and overlapping a portion of the bank. When a first wavelength band of light is irradiated to the photochromic layer, the photochromic layer is in a transparent state. When a second wavelength band of light is irradiated to the photochromic layer, the photochromic layer is in an opaque state, the second wavelength band being shorter than the first wavelength band.

According to embodiments of the disclosure, there may be provided a light emitting display panel and a light emitting display device including the same, comprising a first emission area, a second emission area, and a third emission area spaced apart from each other and emitting different colors of light and a photochromic layer surrounding each of the first, second, and third emission areas and disposed in a non-emission area. When the first emission area, the second emission area, and the third emission area emit light, the photochromic layer is in a transparent state. When light of a wavelength band shorter than visible light is incident on the photochromic layer, the photochromic layer is in an opaque state.

According to embodiments of the disclosure, there may be provided a light emitting display panel, which has a structure capable of delivering improved FOV characteristics as a photochromic layer is disposed in a portion of the non-display area, and a light emitting display device including the same.

According to embodiments of the disclosure, there may be provided a light emitting display panel, which has a structure capable of providing reduced external light reflectance and improved color characteristics as at least two of color filters, a photochromic layer, and a color pattern are disposed on the encapsulation layer, and a light emitting display device including the same.

According to embodiments of the disclosure, there may be provided a light emitting display panel, which has a structure capable of preventing a color mix of the light emitted from different emission areas even without a black matrix by including a photochromic layer and a color pattern, and a light emitting display device including the same.

DESCRIPTION OF THE SEVERAL VIEWS OF THE DRAWINGS

The above and other objects, features, and advantages of the disclosure will be more clearly understood from the following detailed description, taken in conjunction with the accompanying drawings, in which.

DETAILED DESCRIPTION

Figure 1:
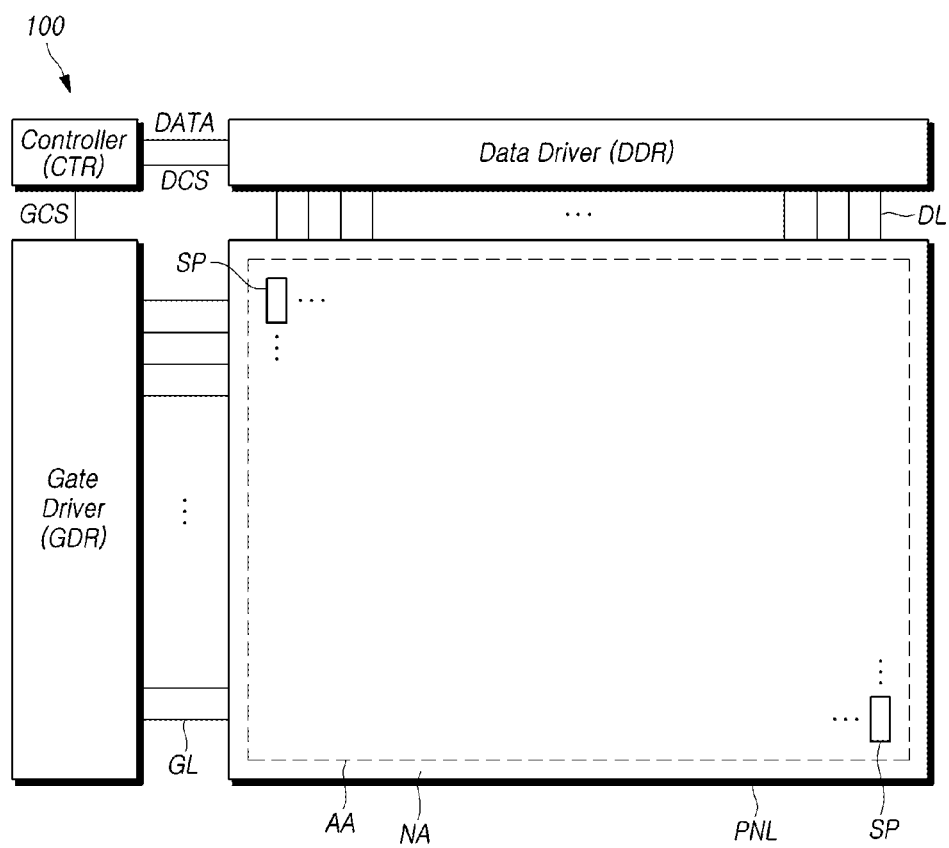
FIG. 1 is a view schematically illustrating a system configuration of a light emitting display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 is a view schematically illustrating a system configuration of a light emitting display device according to embodiments of the disclosure.

According to embodiments of the disclosure, a light emitting display device 100 may include a panel PNL for displaying images or outputting light and a driving circuit for driving the panel PNL.

The panel PNL may include a plurality of data lines DL, a plurality of gate lines GL, and a plurality of subpixels SP overlapped respectively by the plurality of data lines DL and the plurality of gate lines GL and arranged in a matrix type.

In the panel PNL, the plurality of data lines DL and the plurality of gate lines GL may be disposed to cross each other. For example, the plurality of gate lines GL may be arranged in rows or columns, and the plurality of data lines DL may be arranged in columns or rows. For ease of description, it is assumed below that the plurality of gate lines GL are arranged in rows, and the plurality of data lines DL are arranged in columns.

The panel PNL may have other kinds of signal wires, as well as the plurality of data lines DL and the plurality of gate lines GL, depending on, e.g., the subpixel structure. The panel PNL may further have driving voltage wires, reference voltage wires, or common voltage wires.

The kind of the signal wires disposed on the panel PNL may be varied depending on, e.g., the subpixel structure or panel type. In this disclosure, the concept of signal wire may encompass signal-applied electrodes.

The panel PNL may include an active area AA for displaying pictures or images and a non-active area NA, in which substantially no image is displayed, around the active area AA. The non-active area NA is also referred to as a bezel area.

The active area AA includes a plurality of subpixels SP for displaying images.

The non-active area NA has a pad area for electrical connection with a data driver DDR and may have a plurality of data link lines to electrically connect the pad area with the plurality of data lines DL. The plurality of data link lines may be extensions of the plurality of data lines DL to the non-active area NA or may be separate patterns electrically connected with the plurality of data lines DL.

The non-active area NA may also include gate driving-related wires to transfer voltage (signals) for gate driving to a gate driver GDR through pads electrically connected with the data driver DDR. For example, the gate driving-related wires may include clock wires for transferring clock signals, gate voltage wires for transferring gate voltages, and gate driving control signal wires for transferring various control signals used to generate scan signals. The gate driving-related wires are disposed in the non-active area NA, unlike the gate lines GL disposed in the active area AA.

The driving circuit may include the data driver DDR for driving the plurality of data lines DL, the gate driver GDR for driving the plurality of gate lines GL, and a controller CTR for controlling the data driver DDR and the gate driver GDR. The controller CTR may include controller circuitry CTR, and may be referred to as controller circuitry CTR.

The data driver DDR may drive the plurality of data lines DL by outputting data voltage to the plurality of data lines DL.

The gate driver GDR may drive the plurality of gate lines GL by outputting scan signals to the plurality of gate lines GL.

The controller CTR may control the driving operation of the data driver DDR and gate driver GDR by supplying various control signals DCS and GCS for the driving operation of the data driver DDR and gate driver GDR. Further, the controller CTR may supply image data DATA to the data driver DDR.

The controller CTR starts scanning according to a timing implemented in each frame, converts input image data input from the outside into image data DATA suited for the data signal format used in the data driver DDR, outputs the image data DATA, and controls data driving at an appropriate time suited for scanning.

To control the data driver DDR and gate driver GDR, the controller CTR receives timing signals, such as a vertical sync signal, horizontal sync signal, input data enable signal (Data Enable), or clock signal from the outside (e.g., a host system), generate various control signals, and outputs the control signals to the data driver DDR and gate driver GDR.

As an example, to control the gate driver GDR, the controller CTR outputs various gate control signals GCS including a gate start pulse, a gate shift clock, and a gate output enable signal (Gate Output Enable).

To control the data driver DDR, the controller CTR outputs various data control signals DCS including, e.g., a source start pulse, a source sampling clock, and a source output enable signal (Source Output Enable).

The controller CTR may be a timing controller used in typical display technology, or a control device that may perform other control functions as well as the functions of the timing controller.

The controller CTR may be implemented as a separate component from the data driver DDR, or the controller CTR, along with the data driver DDR, may be implemented as an integrated circuit.

The data driver DDR receives the image data DATA from the controller CTR and supply data voltage to the plurality of data lines DL, thereby driving the plurality of data lines DL. Here, the data driver DDR is also referred to as a source driver.

The data driver DDR may exchange various signals with the controller CTR via various interfaces.

The gate driver GDR sequentially drives the plurality of gate lines GL by sequentially supplying scan signals to the plurality of gate lines GL. Here, the gate driver GDR is also referred to as a scan driver.

The gate driver GDR sequentially supplies scan signals of On voltage or Off voltage to the plurality of gate lines GL under the control of the controller CTR.

When a specific gate line is opened by the gate driver GDR, the data driver DDR converts the image data DATA received from the controller CTR into an analog data voltage and supplies the analog data voltage to the plurality of data lines DL.

The data driver DDR may be positioned on only one side (e.g., the top or bottom side) of the panel PNL and, in some cases, the data driver DDR may be positioned on each of two opposite sides (e.g., both the top and bottom sides) of the panel PNL depending on, e.g., driving schemes or panel designs.

The gate driver GDR may be positioned on only one side (e.g., the left or right side) of the panel PNL and, in some cases, the gate driver GDR may be positioned on each of two opposite sides (e.g., both the left and right sides) of the panel PNL depending on, e.g., driving schemes or panel designs.

The data driver DDR may include one or more source driver integrated circuits (SDICs).

Each source driver integrated circuit (SDIC) may include a shift register, a latch circuit, a digital-to-analog converter (DAC), and an output buffer. In some cases, the data driver DDR may further include one or more analog-digital converters (ADC).

Each source driver integrated circuit (SDIC) may be connected, in a tape automated bonding (TAB) type or chip-on-glass (COG) type, to the bonding pad of the panel PNL or may be disposed directly on the panel PNL. In some cases, each source driver integrated circuit (SDIC) may be integrated and disposed on the panel PNL. Each source driver integrated circuit (SDIC) may be implemented in a chip-on-film (COF) type. In this case, each source driver integrated circuit (SDIC) may be mounted on a circuit film and be electrically connected with the data lines DL of the panel PNL through the circuit film.

The gate driver GDR may include a plurality of gate driving circuits (GDC). The plurality of gate driving circuits (GDC) may respectively correspond to the plurality of gate lines GL.

Each gate driving circuit (GDC) may include, e.g., a shift register and a level shifter.

Each gate driving circuit (GDC) may be connected, in a tape automated bonding (TAB) type or chip-on-glass (COG) type, to the bonding pad of the panel PNL. Each gate driving circuit (GDC) may be implemented in a chip-on-film (COF) scheme. In this case, each gate driving circuit (GDC) may be mounted on a circuit film and be electrically connected with the gate lines GL of the panel PNL through the circuit film. Each gate driving circuit (GDC) may be implemented in a gate-in-panel (GIP) type and be embedded in the panel PNL. In other words, each gate driving circuit (GDC) may be formed directly on the panel PNL.

Figure 2:
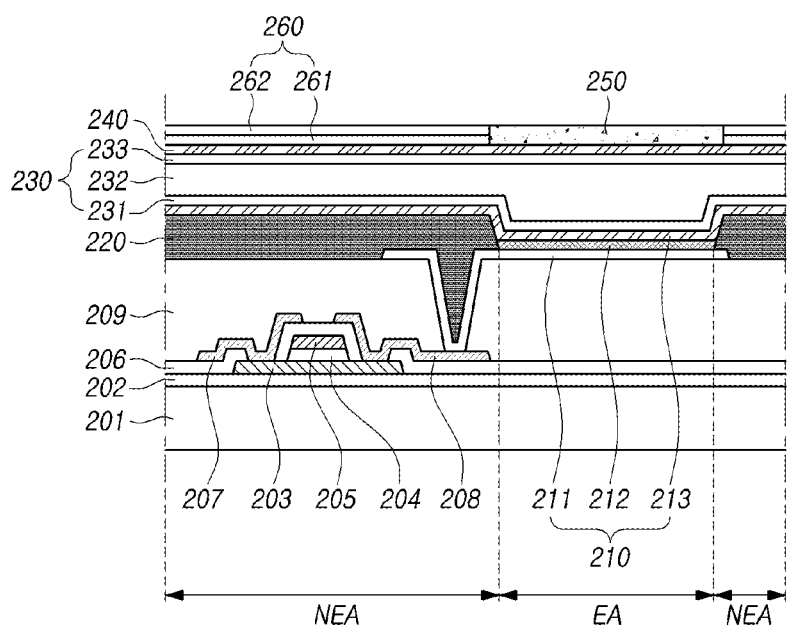
FIG. 2 is a cross-sectional view schematically illustrating a structure of one subpixel area of a light emitting display panel according to embodiments of the disclosure.

FIG. 2 is a cross-sectional view schematically illustrating a structure of one subpixel area of a light emitting display panel according to embodiments of the disclosure.

Referring to FIG. 2, according to embodiments of the disclosure, the light emitting display panel may include at least one thin film transistor disposed on a substrate 201 and a light emitting element 210 disposed on the thin film transistor. Here, the light emitting element 210 may be an organic light emitting element, and the light emitting display panel may be an organic light emitting display panel. However, the present disclosure is not limited thereto, and the light emitting element 210 may be also an inorganic light emitting element.

The thin film transistor may include an active layer 203, a gate electrode 205, a source electrode 207, and a drain electrode 208.

The light emitting element 210 may include a first electrode 211, a light emitting layer 212, and a second electrode 213.

Specifically, a buffer layer 202 may be disposed on the substrate 201.

The buffer layer 202 may include an inorganic insulating material, such as silicon oxide (SiOx), silicon nitride (SiNx), or silicon oxynitride (SiON), but the disclosure is not limited thereto.

In FIG. 2, the buffer layer 202 has a single-layer structure, but the buffer layer 202 of the disclosure may have a multi-layer structure.

If the buffer layer 202 has a multi-layer structure, layers including at least two inorganic insulating materials among inorganic materials, such as silicon oxide (SiOx), silicon nitride (SiNx), or silicon oxynitride (SiON), may be alternately disposed, but the disclosure is not limited thereto.

In the following description, for convenience, a structure in which the buffer layer 202 is a single layer is described.

An active layer 203 of a thin film transistor may be disposed on the buffer layer 202.

The active layer 203 may be various types of semiconductor layers. For example, the active layer 203 may be one selected from among an oxide semiconductor, an amorphous silicon semiconductor, and a polysilicon semiconductor, but the disclosure is not limited thereto.

A gate insulation film 204 may be disposed on the active layer 203.

The gate insulation film 204 may include an inorganic insulating material, such as silicon oxide (SiOx), silicon nitride (SiNx), or silicon oxynitride (SiON), but the disclosure is not limited thereto.

Although FIG. 2 illustrates a structure in which the gate insulation film 204 is disposed on a portion of the upper surface of the active layer 203, the disclosure is not limited thereto, and the gate insulation film 204 is disposed covering the active layer 203.

A gate electrode 205 of the thin film transistor may be disposed on the gate insulation film 204.

The gate electrode 205 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the disclosure is not limited thereto.

An inter-layer insulation film 206 may be disposed on the gate electrode 205.

The inter-layer insulation film 206 may include an inorganic insulating material, such as silicon oxide (SiOx), silicon nitride (SiNx), or silicon oxynitride (SiON), but the disclosure is not limited thereto.

A source electrode 207 and a drain electrode 208 of the thin film transistor may be disposed on the inter-layer insulating layer 206 and may be spaced apart from each other.

Alternatively, in embodiments of the disclosure, the element labeled "207" may be the drain electrode, and the element labeled "208" may be the source electrode.

The source electrode 207 and the drain electrode 208 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the disclosure is not limited thereto.

Each of the source electrode 207 and the drain electrode 208 may be connected (e.g., in contact with) with a portion of the upper surface of the active layer 203 through a contact hole provided in the inter-layer insulating layer 206.

A planarization layer 209 may be disposed on the substrate 201 on which the source electrode 207 and the drain electrode 208 are disposed.

Although not illustrated in the drawings, a protection film including an inorganic insulating material may be further disposed under the planarization layer 209.

A first electrode 211 of the light emitting element 210 may be disposed on a portion of the upper surface of the planarization layer 209.

The first electrode 211 may be electrically connected with the drain electrode 208 of the thin film transistor through a contact hole provided in the planarization layer 209. Although FIG. 2 illustrates a structure in which the first electrode 211 is connected with the drain electrode 208 of the thin film transistor, the disclosure is not limited thereto, and the first electrode 211 may be connected with the source electrode 207 of the thin film transistor.

Although FIG. 2 illustrates a structure in which the first electrode 211 is a single layer, the disclosure is not limited thereto. For example, the first electrode 211 may have a multi-layer structure of two or more layers.

The first electrode 211 may include a reflective electrode.

Specifically, if the first electrode 211 has a single-layer structure, the first electrode 211 may be a reflective electrode including a reflective conductive material.

If the first electrode 211 has a multi-layer structure, at least one layer may be a reflective electrode including a reflective conductive material. The other layers than the reflective electrode may be layers formed of a transparent conductive material.

A bank 220 may be disposed on the planarization layer 209.

The bank 220 may be disposed to overlap a portion of the upper surface of the first electrode 211. The bank 220 may be disposed to expose a portion of the upper surface of the first electrode 211.

The bank 220 may present a visible interface between an emission area EA and a non-emission area NEA in the active area AA of the light emitting display device 100. For example, in the active area AA, the area where the bank 220 is disposed may be the non-emission area NEA, and the area where the bank 220 is not disposed may be the emission area EA.

A light emitting layer 212 of the light emitting element 210 may be disposed on the first electrode 211.

The light emitting layer 212 may be disposed on the upper surface of the first electrode 211 exposed by the bank 220.

Although FIG. 2 illustrates a structure in which the light emitting layer 212 is a single layer, the disclosure is not limited thereto. The light emitting layer 212 may be formed of a multi-layered organic layer.

The light emitting layer 212 may emit light of at least one of red (R), green (G), and blue (B). However, the disclosure is not limited thereto, and the light emitting layer 212 may emit other colors of light, such as white (W).

A second electrode 213 of the light emitting element 210 may be disposed on the substrate 201 on which the light emitting layer 212 is disposed.

The second electrode 213 may include a transparent conductive material or a semi-transmissive material.

Although FIG. 2 illustrates a structure in which the second electrode 213 is a single layer, the disclosure is not limited thereto, and the second electrode 213 may have a multi-layer structure of two or more layers.

An encapsulation layer 230 may be disposed on the second electrode 213.

The encapsulation layer 230 may include a first encapsulation layer 231 disposed on the second electrode 213, a second encapsulation layer 232 disposed on the first encapsulation layer 231, and a third encapsulation layer 233 disposed on the second encapsulation layer 232. The first and third encapsulation layers 231 and 233 may include an inorganic insulating material, and the second encapsulation layer 232 may include an organic insulating material.

The first and third encapsulation layers 231 and 233 including the inorganic insulating material may serve to prevent penetration of moisture and oxygen, and the second encapsulation layer 232 including the organic insulating material may serve to delay the movement of a small amount of moisture and oxygen permeated through the third encapsulation layer 233.

Although not illustrated in the drawings, the encapsulation layer 230 may be disposed not only in the active area AA but also in the non-active area NA of the light emitting display panel.

At least one insulating layer 240 may be disposed on the encapsulation layer 230.

A photochromic layer 260 may be disposed on the insulating layer 240. Furthermore, a color filter 250 may be further disposed on the insulating layer 240. The insulating layer 240 may be omitted or replaced or other layers may be added, according to needs. In other words, the color filter 250 and the photochromic layer 260 may be disposed on the encapsulation layer 230.

The color filter 250 may be disposed in an area corresponding to the emission area EA.

The color filter 250 may be disposed to overlap a portion of the non-emission area NEA, as well as the emission area EA, to secure a process margin. In other words, in plan view, the area of the color filter 250 may be designed to be larger than the area of the emission area EA.

The color filter 250 may be one selected from among red (R), green (G), and blue (B) color filters, but the disclosure is not limited thereto.

The color filter 250 may enhance color characteristics of the light emitted from the light emitting element 210.

Further, the color filter 250 may reduce reflectance of the external light L5 (see FIG. 7) of the polarizing plate-free light emitting display panel of the disclosure, enhancing visibility.

At least one side surface of the color filter 250 may be in contact with the photochromic layer 260.

The photochromic layer 260 may include a first photochromic layer 261 disposed on the encapsulation layer 230 and a second photochromic layer 262 disposed on the first photochromic layer 261.

The photochromic layer 260 may cause a color change depending on the wavelength band of the light incident on the photochromic layer 260. For example, depending on the wavelength band of the light incident on the photochromic layer 260, the photochromic layer 260 may turn transparent or into an opaque state with a specific color.

Depending on the state of the photochromic layer 260, the field-of-view (FOV) characteristics of the light emitting display device 100 may be affected.

This is described below in detail.

Figure 3:
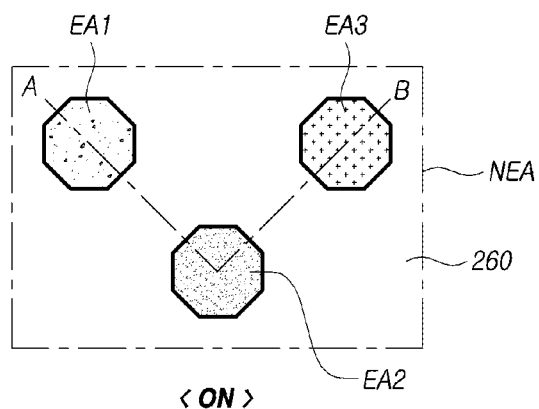
FIG. 3 is a view schematically illustrating an emission area, a non-emission area, and an area in which a photochromic layer is disposed when a light emitting display panel is in an on state according to embodiments of the disclosure.
Figure 4:
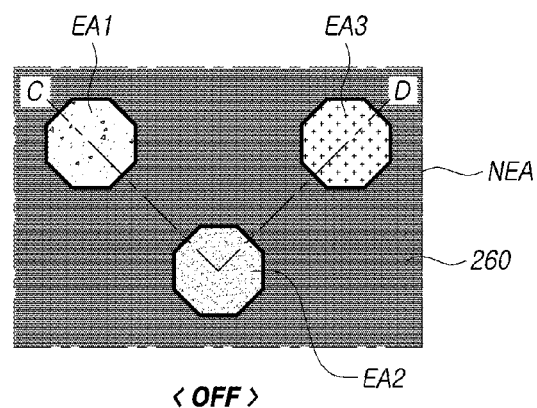
FIG. 4 is a view schematically illustrating an emission area, a non-emission area, and an area in which a photochromic layer is disposed when a light emitting display panel is in an off state according to embodiments of the disclosure.

FIG. 3 is a view schematically illustrating an emission area, a non-emission area, and an area in which a photochromic layer is disposed when a light emitting display panel is in an on state according to embodiments of the disclosure. FIG. 4 is a view schematically illustrating an emission area, a non-emission area, and an area in which a photochromic layer is disposed when a light emitting display panel is in an off state according to embodiments of the disclosure.

Substantially the same configurations and effects as those described above are not repeatedly described below.

Referring to FIG. 3, the active area of the light emitting display panel may include a plurality of emission areas EA1, EA2, and EA3 and a non-emission area NEA surrounding the plurality of emission areas EA1, EA2 and EA3.

Although FIG. 3 illustrates a structure in which the area of the first emission area EA1, the second emission area EA2, and the third emission area EA3 are the same, the disclosure is not limited thereto. For example, at least two of the first to third emission areas EA1, EA2, and EA3 may have different area depending on the lifespan or light emitting characteristics of the light emitting layer (or light emitting element) disposed in each emission area.

As illustrated in FIG. 3, the first to third emission areas EA1, EA2, and EA3 may be octagonal in plan view. However, the disclosure is not limited thereto and, in plan view, the first to third emission areas EA1, EA2, and EA3 may be circular, elliptical, or polygonal or may be formed in a combination of such shapes.

At least two of the first to third emission areas EA1, EA2, and EA3 may be disposed in different rows or in different columns. However, the disclosure is not limited thereto, and the first to third emission areas EA1, EA2, and EA3 may be disposed in the same row or the same column.

When the light emitting display panel is in an on state, light may be emitted from the first to third emission areas EA1, EA2, and EA3 of the light emitting display panel.

The light emitted from the first to third emission areas EA1, EA2, EA3 is light emitted from the light emitting element, and the light emitted from the light emitting element may reach not only the first to third emission areas EA1, EA2, and EA3 but also the photochromic layer 260 positioned in the non-emission area NEA.

If the light emitted from the light emitting element reaches the photochromic layer 260, the photochromic layer 260 may turn transparent.

Further, when the light emitting display panel is in an on state, even when external light is irradiated to the photochromic layer 260 from the outside of the light emitting display panel, the photochromic layer 260 may turn transparent by the influence of the light irradiated from the first to third emission areas EA1, EA2, and EA3.

Accordingly, when the light emitting display panel is in an on state, the FOV characteristics of the panel may be enhanced. In particular, if the light emitting display device 100 is an electronic device that is frequently used outdoors, such as a mobile device or an IT device, the light emitting display device 100 may be prevented from a reduction in visibility due to external light reflection.

As illustrated in FIG. 4, when the light emitting display panel is in an off state, no light may be emitted from the first to third emission areas EA1, EA2, and EA3 of the light emitting display panel.

In this state, if external light is incident on the photochromic layer 260 disposed in the non-emission area NEA of the light emitting display panel, the photochromic layer 260 may turn opaque (e.g., a black state).

Described below are FOV characteristics depending on the transparent state and opaque state of the photochromic layer 260 according to embodiments of the disclosure.

Figure 5:
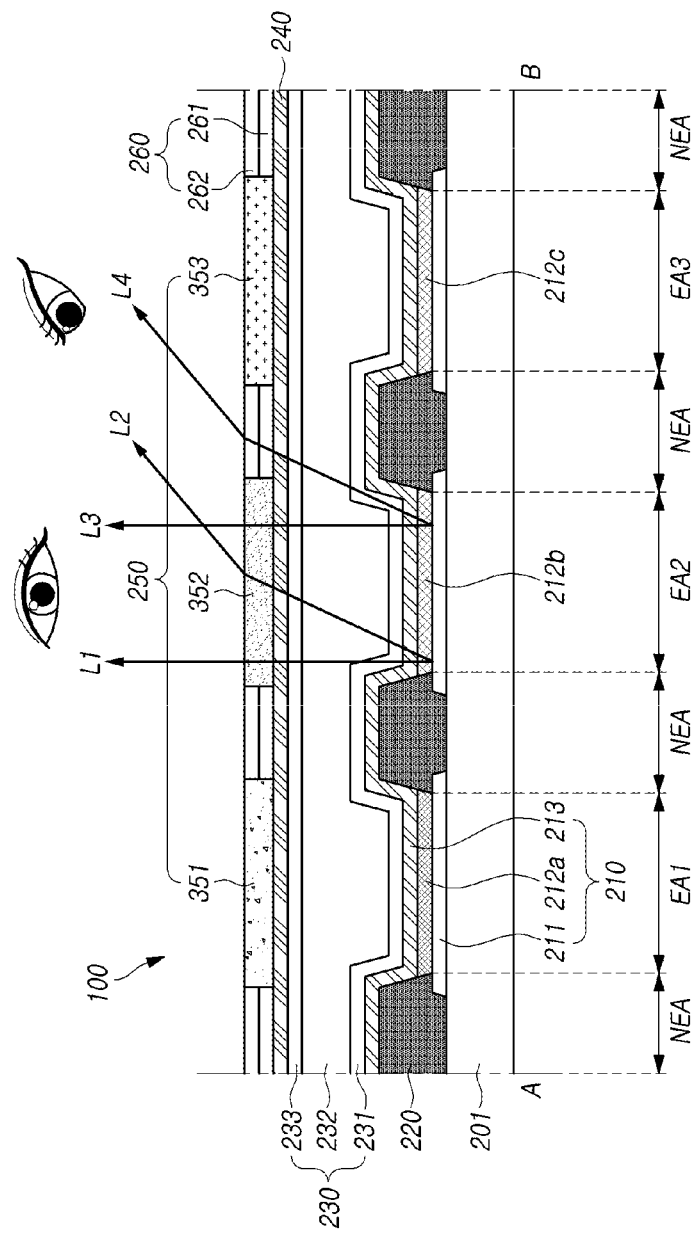
FIG. 5 is a cross-sectional view taken along line A-B of FIG. 3.
Figure 6:
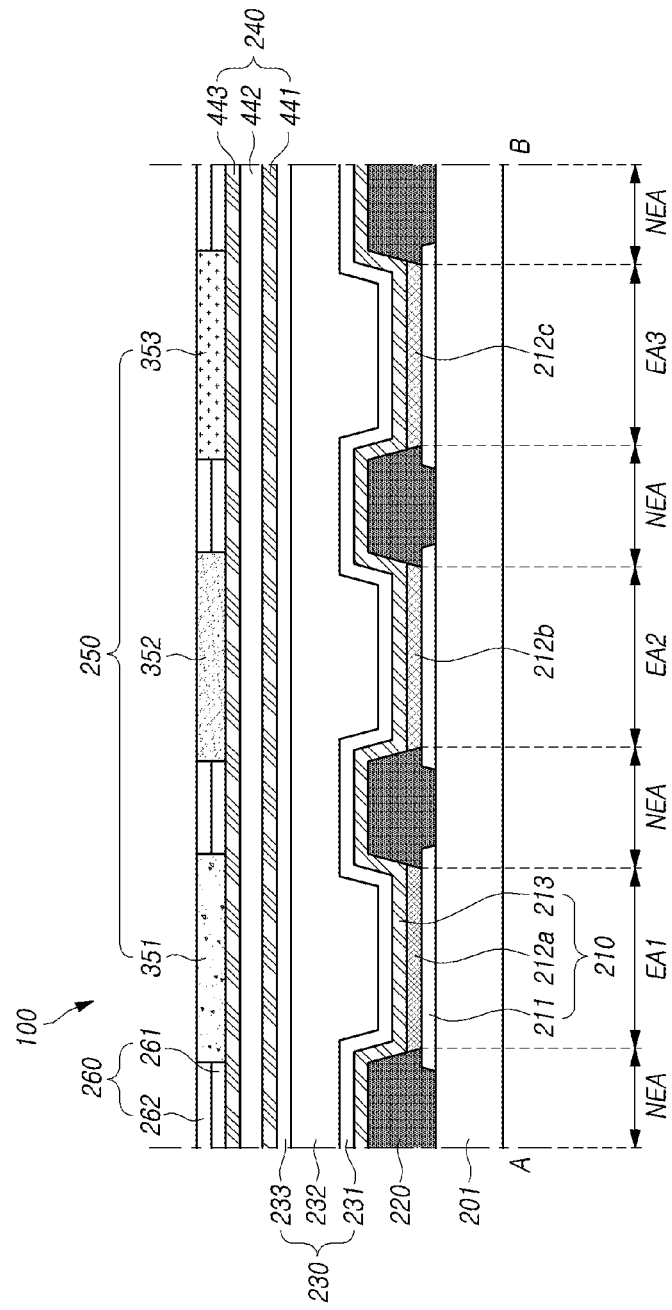
FIG. 6 is a cross-sectional view of another structure taken along line A-B of FIG. 3.
Figure 7:
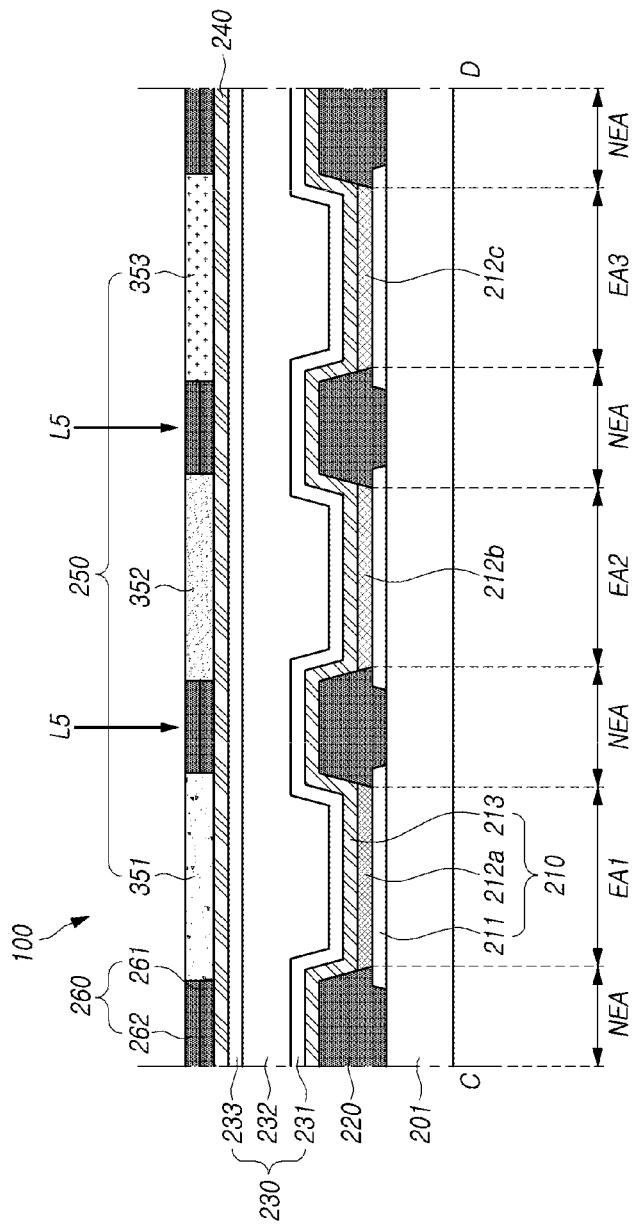
FIG. 7 is a cross-sectional view taken along line C-D of FIG. 4.

FIG. 5 is a cross-sectional view taken along line A-B of FIG. 3. FIG. 6 is a cross-sectional view of another structure taken along line A-B of FIG. 3. FIG. 7 is a cross-sectional view taken along line C-D of FIG. 4.

Substantially the same configurations and effects as those described above are not repeatedly described below.

Referring to FIGS. 5 and 6, according to embodiments of the disclosure, a light emitting display panel may include a plurality of emission areas EA1, EA2, and EA3 provided in the active area.

For example, according to embodiments of the disclosure, the light emitting display panel may include a first emission area EA1, a second emission area EA2, and a third emission area EA3 that emit different colors of light. The first emission area EA1 may be an area in which red (R) light is emitted, the second light emission area EA2 may be an area in which green (G) light is emitted, and the third light emission area EA3 may be an area in which blue (B) light is emitted, but the disclosure is not limited thereto.

In this case, the first light emitting layer 212a of the light emitting element 210 disposed in the first emission area EA1, the second light emitting layer 212b of the light emitting element 210 disposed in the second emission area EA2, and the third light emitting layer 212c of the light emitting element 210 disposed in the third emission area EA3 may emit different colors of light. Red (R) light may be emitted from the first light emitting layer 212a, green (G) light may be emitted from the second light emitting layer 212b, and blue (B) light may be emitted from the third light emitting layer 212c. However, the disclosure is not limited thereto.

The plurality of emission areas EA1, EA2, and EA3 may correspond to an area in which the first electrode 211 that does not overlap the bank 220 is disposed in the active area.

The bank 220 of the light emitting display panel according to embodiments of the disclosure may be formed of an opaque organic material. For example, the bank 220 may be formed of a black organic material, but the disclosure is not limited thereto.

The plurality of emission areas EA1, EA2, and EA3 may have a structure surrounded by the non-emission area NEA. The non-emission area NEA may be an area corresponding to an area in which the bank 220 is disposed in the active area.

Although FIGS. 5 and 6 illustrate a structure in which the first electrode 211 and the bank 220 are disposed on the substrate 201, the structure of the light emitting display panel of the disclosure is not limited thereto. For example, as illustrated in FIG. 2, a thin film transistor electrically connected with the first electrode 211 may be further disposed on the substrate 201.

An encapsulation layer 230 may be disposed on the light emitting element 210 to protect the light emitting element 210 from foreign objects, such as moisture and oxygen.

An insulating layer 240 may be disposed on the encapsulation layer 230.

Although FIG. 5 illustrates a structure in which the insulating layer 240 is a single layer, the disclosure is not limited thereto.

For example, as illustrated in FIG. 6, the insulating layer 240 disposed on the encapsulation layer 230 may have a multi-layer structure.

As illustrated in FIG. 6, a first insulating layer 441 may be disposed on the third encapsulation layer 233, a second insulating layer 442 may be disposed on the first insulating layer 441, and a third insulating layer 443 may be disposed on the second insulating layer 442, but this is merely an example, and at least two insulating layers 240 may be disposed on the encapsulation layer 230.

As illustrated in FIGS. 5 and 6, a photochromic layer 260 may be disposed on the encapsulation layer 230. Furthermore, preferably, a plurality of color filters 250 may be further disposed on the encapsulation layer 230.

The plurality of color filters 250 may include a first color filter 351, a second color filter 352, and a third color filter 353 having different colors. For example, the first color filter 351 may be a red (R) color filter, the second color filter 352 may be a green (G) color filter, and the third color filter 353 may be a blue (B) color filter, but the disclosure is not limited thereto.

Considering a process margin, one color filter disposed to correspond to one emission area may overlap one emission area, and may also overlap a portion of the non-emission area NEA surrounding the emission area. In other words, as illustrated in FIG. 2, each of the first color filter 351, the second color filter 352, and the third color filter 353 may overlap an area in which the first electrode 211 and the bank 220 overlap each other.

However, the disclosure is not limited thereto. For example, as illustrated in FIG. 5, the first color filter 351, the second color filter 352, and the third color filter 353 may be disposed to correspond to a first emission area EA1, a second emission area EA2, and a third emission area EA3, respectively. In one embodiment, the first color filter 351, the second color filter 352 and the third color filter 353 do not overlap the non-emission area NEA.

According to the prior art, the light emitting display panel typically uses a polarizing plate to reduce reflection of external light L5 (see FIG. 7). However, use of the polarizing plate may increase manufacturing costs and, and due to its low light transmittance, reduce the brightness of the light emitting display panel, with the result of deteriorated display quality.

According to embodiments of the disclosure, the light emitting display panel does not include such a polarizing plate and has a plurality of color filters 250 on the encapsulation layer 230, thereby reducing external light reflection while enhancing brightness as compared with when a polarizing plate is used.

Further, the light emitting display panel according to the embodiments of the disclosure includes the bank 220 which is opaque. The bank 220 may absorb the light reflected by the plurality of wires and electrodes disposed in the panel, thereby preventing an increase in reflectance due to wiring and electrodes.

Further, since the plurality of color filters 250 have higher light transmittance than the polarizing plate, the light emitting display panel according to embodiments of the disclosure may have high brightness characteristics.

Further, as described above, the plurality of color filters 250 include the first to third color filters 351, 352, and 353, and the first to third color filters 351, 352, and 353 are disposed to correspond to the emission areas EA1, EA2, and EA3, respectively, emitting colors of light corresponding to the colors of the first to third color filters 351, 352, and 353. Thus, more crisp colors of light are visible through the first to third color filters 351, 352, and 353.

A conventional light emitting display panel may include a black matrix disposed in an area overlapping the non-emission area. The black matrix may be disposed between neighboring subpixels (e.g., between the red and green subpixels, between the green and blue subpixels, or between the blue and red subpixels).

When a user views the light emitting display panel from the front, the screen may look clear. When the user views the light emitting display panel from the front, this means that the user views the light emitting display panel from a direction perpendicular to the surface of the substrate 201.

However, if the user views the light emitting display panel from a side, the light emitted from the plurality of emission areas EA1, EA2, and EA3 may be absorbed by the black matrix, so that the brightness of the image may be reduced as compared when the light emitting display panel is viewed from the front. When the user views the light emitting display panel from a side, this means that the user views the light emitting display panel at an angle other than an angle between the surface of the substrate 201 and any straight line perpendicular to the surface of the substrate 201 and an angle between the surface of the substrate 201 and any line parallel with the surface of the substrate 201.

As a specific example, as illustrated in FIG. 5, although the user views the light emitting display panel from the front or from a side, some L1 and L2 of the light beams from the plurality of emission areas EA1, EA2, and EA3 may be visible. Here, L1 and L2 may be light beams emitted from the same position on the light emitting layer 212.

Although light beams L3 and L4 are emitted from the same position on the light emitting layer 212, some light beam L4 may be visible when the user views the light emitting display panel from the front, but not when viewing from a side. In a conventional typical light emitting display panel, the light beam L4 is absorbed by the black matrix and is thus not delivered to the user.

Thus, the user may feel a reduction in brightness when viewing the light emitting display panel from a side, as compared with when viewing the light emitting display panel from the front.

However, in the light emitting display panel according to embodiments of the disclosure, although the light emitting display panel is viewed from a side, the same brightness as when the light emitting display panel is viewed from the front may be provided by the photochromic layer 260 laterally surrounding the color filters 250.

The photochromic layer 260 may include a first photochromic layer 261 disposed on the encapsulation layer 230 and a second photochromic layer 262 disposed on the first photochromic layer 261.

Each of the plurality of color filters 250 may be laterally surrounded by the photochromic layer 260. At least a first side surface of each photochromic layer 260 may contact a side surface of one of the first color filter 351, the second color filter 352, and the third color filter 353. A second side surface (e.g., the surface opposite to the first side surface) of each photochromic layer 260 may contact a side surface of one of the other color filters.

The photochromic layer 260 may overlap the non-emission area NEA in the active area.

When a first wavelength band of light is irradiated to the first photochromic layer 261 and the second photochromic layer 262 of the photochromic layer 260, the first photochromic layer 261 and the second photochromic layer 262 may be in a transparent state.

The first wavelength band may range from more than 380 nm and less than 760 nm. In other words, the first wavelength band may be a visible light wavelength band.

When an electric field is applied to the light emitting element 210 including the first electrode 211 including a reflective electrode (that is, when the light emitting display panel is in an on state), the light emitted from the light emitting element 210 may be directed toward the color filters 250 and the photochromic layer 260.

The first to third color filters 351, 352, and 353 may transmit the light emitted from the light emitting element 210 at wavelengths corresponding to the respective colors of the color filters 351, 352, and 353.

The light emitted from the light emitting element 210 and reaching the first and second photochromic layers 261 and 262 may allow the first and second photochromic layers 261 and 262 to turn transparent.

Specifically, the light emitted from the light emitting element 210 according to the embodiments of the disclosure may include light in a visible light wavelength band (a wavelength band ranging from more than 380 nm and less than 760 nm), and thus, if the light emitted from the light emitting element 210 reaches the first and second photochromic layers 261 and 262, the first and second photochromic layers 261 and 262 may become transparent.

Accordingly, even when the user views the light emitting display panel from the side, the light beam L4 having the path as shown in FIG. 5 may be seen, so that the FOV may be enhanced. In other words, although the light emitting display panel is viewed from the side, as much light as it is viewed from the front may be seen, so that the same brightness level may be maintained whether it is viewed from the front or side.

If the light emitting element 210 included in the light emitting display panel does not emit light (that is, when the light emitting display panel is in an off state), the photochromic layer 260 may turn opaque.

This is described below with reference to FIG. 7.

FIG. 7 is a view illustrating a portion of an active area when a light emitting display panel is in an off state according to embodiments of the disclosure.

Substantially the same configurations and effects as those described above are not repeatedly described below.

Referring to FIG. 7, when the light emitting display panel according to embodiments of the disclosure is in an off state, each of the first and second photochromic layers 261 and 262 may be in an opaque state. In this case, a second wavelength band of light may have been irradiated to the first and second photochromic layers 261 and 262.

Specifically, if the first photochromic layer 261 and the second photochromic layer 262 are irradiated with the light of the second wavelength band, which is shorter than the first wavelength band, rather than the first wavelength band of light, the first photochromic layer 261 and the second photochromic layer 262 may remain opaque.

The second wavelength band may range from 100 nm or more and 380 nm or less. In other words, the second wavelength band may be an ultraviolet wavelength band.

For example, if the light emitting display panel is in an off state (a state in which no electric field is applied to the light emitting element 210) and external light L5 is incident on the light emitting display panel, the first and second photochromic layers 261 and 262 may remain opaque.

Specifically, since the external light L5 is light including an ultraviolet wavelength band (e.g., a wavelength band ranging from 100 nm or more and 380 nm or less), if the external light L5 reaches the first and second photochromic layers 261 and 262 while the light emitting display panel is in an off state, the first and second photochromic layers 261 and 262 may become opaque.

When the first photochromic layer 261 and the second photochromic layer 262 are opaque, the color of the first photochromic layer 261 and the color of the second photochromic layer 262 may be different from each other. The color of the first photochromic layer 261 and the color of the second photochromic layer 262 may be selected from among red (R), green (G), and blue (B).

For example, when the photochromic layer 260 is opaque, and the first photochromic layer 261 is red (R), the second photochromic layer 262 may be blue (B) or green (G). When the photochromic layer 260 is opaque, and the first photochromic layer 261 is green (G), the second photochromic layer 262 may be red (R) or blue (B) and, when the photochromic layer 260 is opaque, and the first photochromic layer 261 is blue (B), the second photochromic layer 262 may be red (R) or green (G).

The photochromic layer 260 in which the first and second photochromic layers 261 and 263 are stacked one over the other may implement a black.

In other words, if the external light L5 is incident on the photochromic layer 260 which is black, the external light reflectance may be reduced due to the light blocking properties of the photochromic layer 260.

In other words, when light corresponding to a visible light wavelength band (e.g., the light emitted from the light emitting element) is irradiated to the first and second photochromic layers 261 and 262 according to embodiments of the disclosure, each of the first and second photochromic layers 261 and 262 may turn transparent. When the light emitting display panel switches from the on state to an off state, and external light L5 is irradiated to the first and second photochromic layers 261 and 262, the first and second photochromic layers 261 and 262 may turn to different colors. When the light emitting display panel is in an on state, the first and second photochromic layers 261 and 262 may be in a transparent state because visible light inside the light emitting display panel has a higher intensity than ultraviolet rays. However, when the light emitting display panel is in an off state, the first and second photochromic layers 261 and 262 may be in an opaque state because ultraviolet rays have a higher intensity.

The first and second photochromic layers 261 and 262 may be formed of any one selected from among thiopheneperfluoropentene, benzothiopheneperfluoropentene, benzothiophenecyanoethene, benzothiophenemaleicanhydride, and benzothiophenesulfoneperfluoropetene.

For example, if the first photochromic layer 261 is formed of any one selected from among thiopheneperfluoropentene, benzothiopheneperfluoropentene, and benzothiophenecyanoethene, the second photochromic layer 262 may be formed of any one selected from among benzothiophenemaleicanhydride and benzothiophenesulfoneperfluoropetene, but this is merely an example, and embodiments of the disclosure are not limited thereto. For example, the first and second photochromic layers 261 and 262 may be formed of any materials that may turn to different colors.

Thiopheneperfluoropentene, benzothiopheneperfluoropentene, and benzothiophenecyanoethene may be materials that may turn to red (R) when irradiated with an ultraviolet wavelength band of light, benzothiophenemaleicanhydride may be a material that may turn to blue (B) when irradiated with an ultraviolet wavelength band of light, and benzothiophenesulfoneperfluoropetene may be a material that may turn to green (G) when irradiated with an ultraviolet wavelength band of light.

In the light emitting display panel according to embodiments of the disclosure, the color filters and the photochromic layer may have various structures to enhance color coordinate characteristics.

This is described below in detail.

Figure 8:
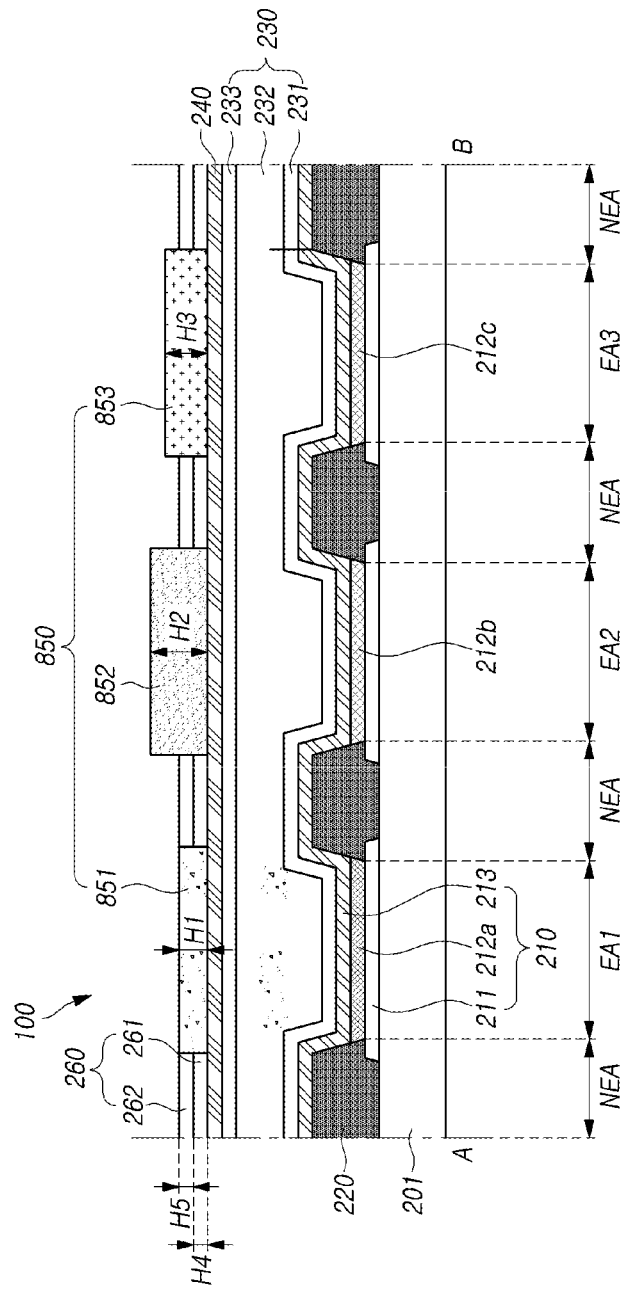
FIG. 8 is a cross-sectional view illustrating a structure of a portion of an active area of a light emitting display panel according to an embodiment of the disclosure.

FIG. 8 is a cross-sectional view illustrating a structure of a portion of an active area of a light emitting display panel according to an embodiment of the disclosure.

Substantially the same configurations and effects as those described above are not repeatedly described below.

In FIG. 8, the structure in which the light emitting element 210 and the bank 220 are disposed on the substrate 201 may be the same as the structure of FIG. 2.

Referring to FIG. 8, according to an embodiment of the disclosure, a light emitting display panel may include a color filter 850 and a photochromic layer 260 disposed on an encapsulation layer 230.

The color filter 850 may include a plurality of color filters having different colors. For example, as illustrated in FIG. 8, the color filter 850 may include a first color filter 851, a second color filter 852, and a third color filter 853 representing different colors.

At least two color filters among the first to third color filters 851, 852, and 853 may have different heights.

The first color filter 851, the second color filter 852, and the third color filter 853 may have a first height H1, a second height H2, and a third height H3, respectively. For example, the second height H2 may be larger than the first and third heights H1 and H3, and the third height H3 may be larger than the first height H1.

The first to third heights H1, H2, and H3 may mean the shortest bottom-to-top lengths of the respective corresponding color filters.

As described above, the light emitting display panel may be adjusted to its target color coordinates by making at least two color filters among the first to third color filters 851, 852, and 853 have different heights.

The height of at least one of the first to third color filters 851, 852, and 853 may correspond to the sum of a height H4 of the first photochromic layer 261 and a height H5 of the second photochromic layer 262.

For example, as illustrated in FIG. 8, the sum of the height H4 of the first photochromic layer 261 and the height H5 of the second photochromic layer 262 may correspond to the height, e.g., the first height H1, of the first color filter 851. The height of at least one of the first to third color filters 851, 852, and 853 may be larger than a sum of the height H4 of the first photochromic layer 261 and the height H5 of the second photochromic layer 262. For example, the sum of the height H4 of the first photochromic layer 261 and the height H5 of the second photochromic layer 262 may be smaller than the respective second and third heights H2 and H3 of the second and third color filters 852 and 853. For example, the first height H1 may be substantially equal to the sum of the heights H4, H5.

The respective heights H4 and H5 of the first and second photochromic layers 261 and 261 may mean the shortest bottom-to-top lengths of the respective corresponding photochromic layers.

When the light emitting display panel according to embodiments of the disclosure is in an on state, even if the light emitting display panel is viewed from the side, the light emitted from the light emitting element 210 may be transmitted through the first and second photochromic layers 261 and 262 and visually perceived by the user. Thus, although the user views the light emitting display panel from the side, clear images may be delivered to the user in a wider FOV.

Although a structure in which the light emitting display panel includes the first to third emission areas EA1, EA2, and EA3 has been described above in connection with FIGS. 3 to 8, the disclosure is not limited thereto.

For example, the light emitting display panel according to embodiments of the disclosure may further include at least one emission area emitting light of a color different from those of the first to third emission areas EA1, EA2, and EA3.

This is described below with reference to FIG. 9.

Figure 9:
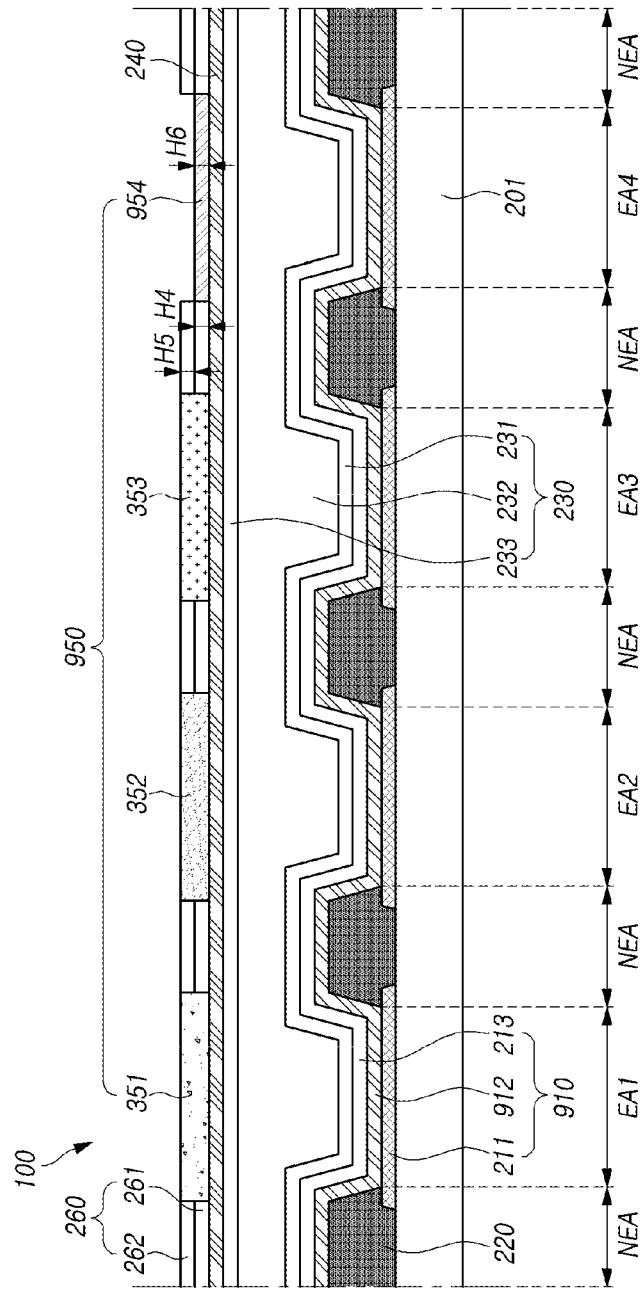
FIG. 9 is a cross-sectional view illustrating a light emitting display panel according to an embodiment of the disclosure.

FIG. 9 is a cross-sectional view illustrating a light emitting display panel according to an embodiment of the disclosure.

Substantially the same configurations and effects as those described above are not repeatedly described below.

Referring to FIG. 9, according to embodiments of the disclosure, a light emitting display panel may include a first emission area EA1, a second emission area EA2, a third emission area EA3, and a fourth emission area EA4 that emit different colors of light.

In this case, as illustrated in FIG. 9, the light emitting layer 912 of the light emitting element 910 may be disposed to overlap the first electrode 211 and the bank 220. For example, the light emitting layer 912 of the light emitting element 910 may be disposed on the entire surface of the substrate 201 in the active area, but the structure of the light emitting layer 912 according to the embodiment of the disclosure is not limited thereto. As illustrated in FIGS. 2, 5 to 8, the light emitting layer 212 of the light emitting element 210 may be disposed only on the upper surface of the first electrode 211 exposed by the bank 220.

In this case, the first emission area EA1 may be an emission area emitting red (R) light, the second emission area EA2 may be an emission area emitting green (G) light, the third emission area EA3 may be an area emitting blue (B) light, and the fourth emission area EA4 may be an area emitting white (W) light.

A first color filter 351 may be disposed on the encapsulation layer 230 in the first emission area EA1, a second color filter 352 may be disposed on the encapsulation layer 230 in the second emission area EA2, a third color filter 353 may be disposed on the encapsulation layer 230 in the third emission area EA3, and a fourth color filter 954 may be disposed on the encapsulation layer 230 in the fourth emission area EA4.

The first color filter 351 may be a red (R) color filter, the second color filter 352 may be a green (G) color filter, and the third color filter 353 may be a blue (B) color filter. The fourth color filter 954 may have the same color as any one of the first to third color filters 351, 352, and 353 or may have a color (e.g., sky blue) different from the first to third color filters 351, 352 and 353.

To enhance the color characteristics of the fourth emission area EA4, the height H6 of the fourth color filter 954 may be smaller than the height of each of the first to third color filters 351, 352, and 353.

The height H6 of the fourth color filter 954 may be smaller than the sum of the height H4 of the first photochromic layer 261 and the height H5 of the second photochromic layer 262. Accordingly, a step may exist at the boundary between the fourth color filter 954 and the photochromic layer 260.

Although not illustrated in FIG. 9, another planarization layer may be further disposed on the color filter 950 and the photochromic layer 260.

Further, the light emitting display panel according to embodiments of the disclosure may include a structure capable of preventing mix of different colors of light during driving.

Figure 10:
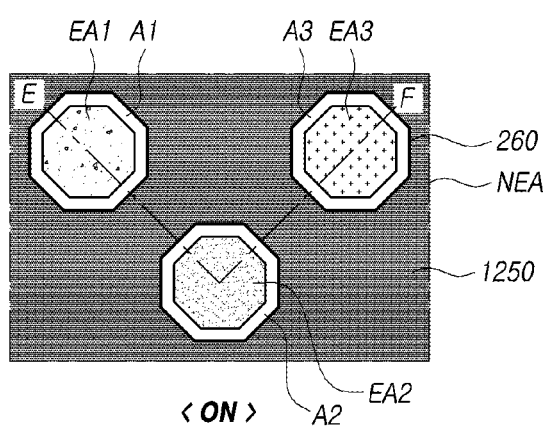
FIG. 10 is a view schematically illustrating an emission area, a non-emission area, and an area in which a photochromic layer is disposed when a light emitting display panel is in an on state according to an embodiment of the disclosure.
Figure 11:
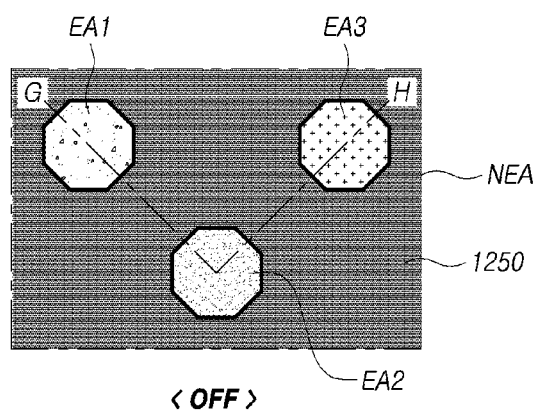
FIG. 11 is a view schematically illustrating an emission area, a non-emission area, and an area in which a photochromic layer is disposed when a light emitting display panel is in an off state according to an embodiment of the disclosure.

FIG. 10 is a view schematically illustrating an emission area, a non-emission area, and an area in which a photochromic layer is disposed when a light emitting display panel is in an on state according to an embodiment of the disclosure. FIG. 11 is a view schematically illustrating an emission area, a non-emission area, and an area in which a photochromic layer is disposed when a light emitting display panel is in an off state according to an embodiment of the disclosure.

Substantially the same configurations and effects as those described above are not repeatedly described below.

Referring to FIG. 10, the active area of the light emitting display panel may include a plurality of emission areas EA1, EA2, and EA3 and a non-emission area NEA surrounding the plurality of emission areas EA1, EA2 and EA3.

The plurality of emission areas EA1, EA2, and EA3 may include a first emission area EA1, a second emission area EA2, and a third emission area EA3.

A first area A1 may be disposed between the first emission area EA1 and the non-emission area NEA, a second area A2 may be disposed between the second emission area EA2 and the non-emission area NEA, and a third area A3 may be disposed between the third emission area EA3 and the non-emission area NEA.

The first to third areas A1, A2, and A3 may be areas in which a photochromic layer is disposed.

A color pattern may be disposed in the remaining non-emission area NEA in which no photochromic layer is disposed, preventing a color mix between the emission areas when the organic light-emitting display panel is driven.

In other words, when the light emitting display panel is in an on state, the light emitted from the light emitting element may reach not only the emission area but also the non-emission area NEA. Accordingly, in the emission area, the light from the light emitting element may be emitted to the outside of the light emitting display panel.

When the light emitted from the light emitting element reaches the photochromic layer disposed in the non-emission area NEA, the photochromic layer may turn transparent. Thus, the light transmitted through the areas (e.g., the first to third areas), in which the photochromic layer is disposed, as well as the emission areas, may be visually perceived by the user who is viewing the panel from a side.

Further, the light emitted from the light emitting element may be absorbed by the color pattern in the non-emission area NEA.

As illustrated in FIG. 11, when the light emitting display panel is in an off state, no light may be emitted from the first to third emission areas EA1, EA2, and EA3 of the light emitting display device 100.

In this state, if external light is incident on the photochromic layer 260 disposed in the non-emission area NEA of the light emitting display panel, the photochromic layer 260 may turn opaque (e.g., a black state).

Accordingly, even when external light is incident on the light emitting display panel, the external light may be absorbed by the photochromic layer 260 and the color pattern disposed in the non-emission area NEA, thereby reducing external light reflectance.

The light emitting display panel having the structures of FIGS. 10 and 11 is described below in greater detail.

Figure 12:
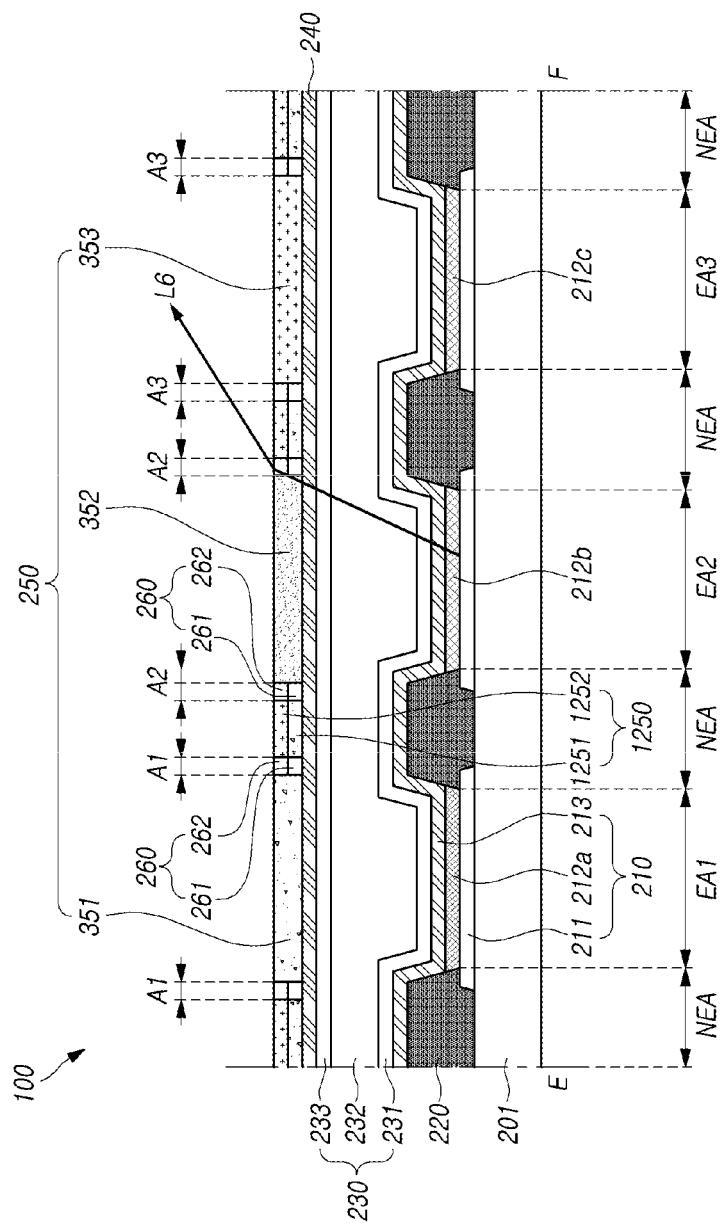
FIG. 12 is a cross-sectional view taken along line E-F of FIG. 10.
Figure 13:
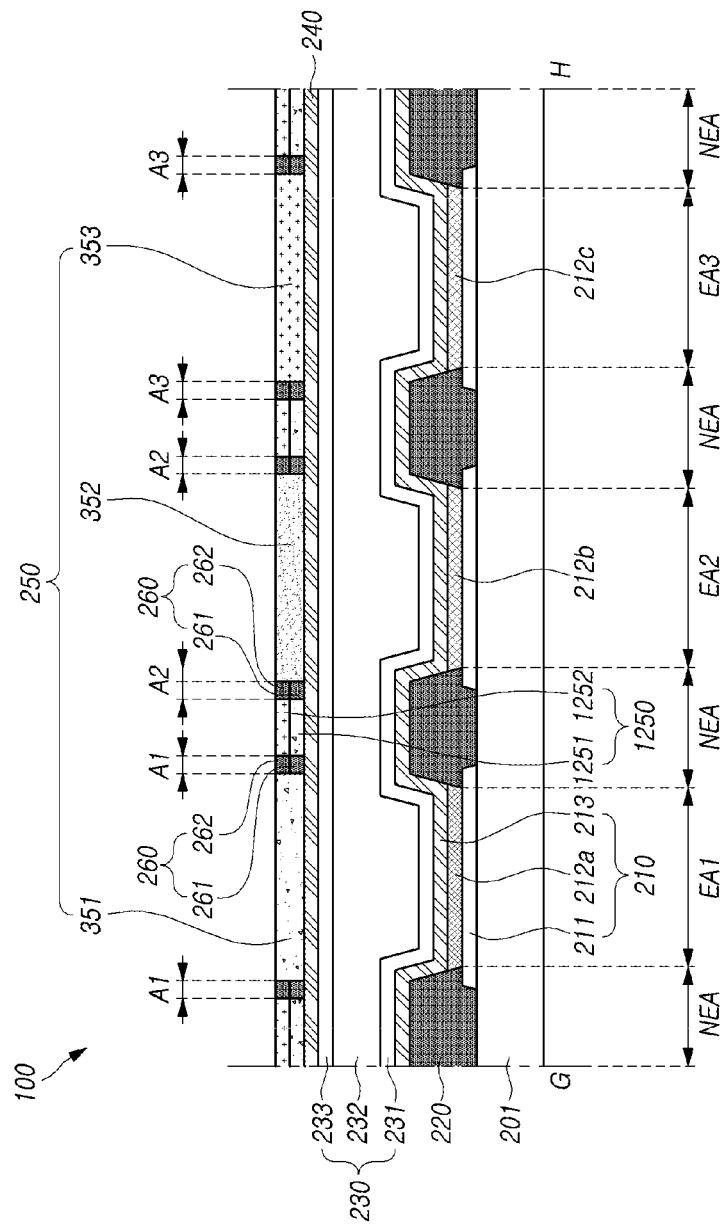
FIG. 13 is a cross-sectional view taken along line G-H of FIG. 11.

FIG. 12 is a cross-sectional view taken along line E-F of FIG. 10. FIG. 13 is a cross-sectional view taken along line G-H of FIG. 11.

Substantially the same configurations and effects as those described above are not repeatedly described below.

The structure in which the light emitting element 210 and the bank 220 are disposed as illustrated in FIGS. 12 and 13 may be the same as the structure in which the light emitting element 210 and the bank 220 are disposed as illustrated in FIG. 5.

Referring to FIG. 12, a plurality of color filters 250 and a photochromic layer 260 may be disposed on the encapsulation layer 230.

The plurality of color filters 250 may include a first color filter 351, a second color filter 352, and a third color filter 353 having different colors.

Each of the first to third color filters 351, 352, and 353 may be laterally surrounded by the photochromic layer 260.

The photochromic layer 260 may overlap the non-emission area NEA in the active area.

One side surface of the photochromic layer 260 may be surrounded by a color pattern 1250. The photochromic layer 260 are disposed between the color pattern 1250 and the first emission area EA1, between the color pattern 1250 and the second emission area EA2, and between the color pattern 1250 and the third emission area EA3.

The color pattern 1250 may include a first color pattern 1251 disposed on the encapsulation layer 230 and a second color pattern 1252 disposed on the first color pattern 1251.

The first color pattern 1251 and the second color pattern 1252 may be color patterns of different colors. The first color pattern 1251 and the second color pattern 1252 may be formed in colors selected from among red (R), green (G), and blue (B).

For example, when the first color pattern 1251 is a red (R) color pattern, the second color pattern 1252 may have a color selected from among green (G) and blue (B).

As described above, as the first and second color patterns 1251 and 1252 of different colors overlap each other, the color pattern 1250 may implement a black.

Accordingly, when the light emitting display panel is driven, the light emitted from the light emitting element and reaching the color pattern 1250 may be absorbed by the color pattern 1250, preventing a mix of different colors of light emitted from the emission areas from being viewed by the user.

Further, even if external light is incident when the light emitting display panel is driven, the external light may be absorbed by the color pattern 1250, enhancing the visibility of the light emitting display panel.

Further, when the light emitting display panel is driven, the light emitted from the light emitting element 210 and reaching the first and second photochromic layers 261 and 262 may allow the first and second photochromic layers 261 and 262 to turn transparent.

Accordingly, even when the user views the light emitting display panel from the side, the light beam L6 having the path as shown in FIG. 12 may be seen. In other words, although the light emitting display panel is viewed from the side, as much light as it is viewed from the front may be seen, so that the same brightness level may be maintained whether it is viewed from the front or side.

In contrast, as illustrated in FIG. 13, when the light emitting display panel is in an off state, each of the first and second photochromic layers 261 and 262 may be in an opaque state.

Specifically, if the light emitting display panel is in an off state (a state in which no electric field is applied to the light emitting element 210) and external light is incident on the light emitting display panel, the first and second photochromic layers 261 and 262 may remain opaque.

When the first photochromic layer 261 and the second photochromic layer 262 are opaque, the color of the first photochromic layer 261 and the color of the second photochromic layer 262 may be different from each other. The color of the first photochromic layer 261 and the color of the second photochromic layer 262 may be selected from among red (R), green (G), and blue (B).

As described above, as the first and second photochromic layers 261 and 262 having different colors are stacked, the photochromic layer 260 may implement a black.

The first color pattern 1251 and the second color pattern 1252 may be color patterns of different colors. The first color pattern 1251 and the second color pattern 1252 may be formed in colors selected from among red (R), green (G), and blue (B).

As described above, as the first and second color patterns 1251 and 1252 of different colors are stacked one over the other, the color pattern 1250 may implement a black.

Accordingly, even when external light is incident on the light emitting display panel, the external light may be absorbed by the photochromic layer 260 and the color pattern 1250 disposed in the non-emission area NEA, thereby reducing external light reflectance.

According to embodiments of the disclosure, there may be provided a light emitting display panel, which has a structure capable of delivering improved FOV characteristics as a photochromic layer is disposed in a portion of the non-display area, and a light emitting display device including the same.

According to embodiments of the disclosure, there may be provided a light emitting display panel, which has a structure capable of providing reduced external light reflectance and improved color characteristics as at least two of color filters, a photochromic layer, and a color pattern are disposed on the encapsulation layer, and a light emitting display device including the same.

According to embodiments of the disclosure, there may be provided a light emitting display panel, which has a structure capable of preventing a color mix of the light emitted from different emission areas even without a black matrix by including a photochromic layer and a color pattern, and a light emitting display device including the same.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure. Thus, the scope of the disclosure is not limited to the embodiments shown, but is to be accorded the widest scope consistent with the claims. The scope of protection of the disclosure should be construed based on the following claims, and all technical ideas within the scope of equivalents thereof should be construed as being included within the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display panel, comprising:
a substrate;
a first electrode disposed on the substrate;
a bank overlapping a portion of an upper surface of the first electrode;
a light emitting layer disposed on the first electrode;
a second electrode disposed on the light emitting layer;
an encapsulation layer disposed on the second electrode;
a photochromic layer disposed on the encapsulation layer, and overlapping a portion of the bank, wherein when a first wavelength band of light is irradiated to the photochromic layer, the photochromic layer is in a transparent state, and wherein when a second wavelength band of light is irradiated to the photochromic layer, the photochromic layer is in an opaque state, the second wavelength band being shorter than the first wavelength band, wherein the light emitting display panel includes an emission area and a non-emission area, and wherein the photochromic layer is disposed in the non-emission area and surrounds the emission area.

2. The light emitting display panel of claim 1, wherein when no light is emitted from the light emitting layer, the second wavelength band of light is irradiated to the photochromic layer from an outside of the light emitting display panel.

3. The light emitting display panel of claim 1, wherein when light is emitted from the light emitting layer, the first wavelength band of light is irradiated to the photochromic layer.

4. The light emitting display panel of claim 3, wherein when light is emitted from the light emitting layer, and the second wavelength band of light is irradiated to the photochromic layer from an outside of the light emitting display panel, the photochromic layer is in the transparent state.

5. The light emitting display panel of claim 1, wherein the first wavelength band ranges from more than 380 nm to less than 760 nm, and the second wavelength band ranges from 100 nm or more to 380 nm or less.

6. The light emitting display panel of claim 1, further comprising a plurality of color filters disposed on the encapsulation layer and spaced apart from each other, wherein the photochromic layer is disposed between at least two of the plurality of color filters.

7. The light emitting display panel of claim 1, wherein the photochromic layer includes a first photochromic layer disposed on the encapsulation layer and a second photochromic layer disposed on the first photochromic layer.

8. The light emitting display panel of claim 7, wherein when the first photochromic layer and the second photochromic layer are in the opaque state, a color of the first photochromic layer differs from a color of the second photochromic layer.

9. The light emitting display panel of claim 8, wherein the color of the first photochromic layer and the color of the second photochromic layer are each selected from among red, green, and blue.

10. The light emitting display panel of claim 7, wherein the emission area is an area in which the first electrode that does not overlap the bank is disposed, and wherein the emission area of the light emitting display panel includes at least two emission areas, wherein the at least two emission areas, in operation, each emit a different color of light.

11. The light emitting display panel of claim 10, wherein the at least two emission areas includes a first emission area, a second emission area, and a third emission area, and wherein a first color filter corresponding to the first emission area, a second color filter corresponding to the second emission area, and a third color filter corresponding to the third emission area are disposed on the encapsulation layer.

12. The light emitting display panel of claim 11, wherein at least two of the first color filter, the second color filter, and the third color filter have different heights from each other.

13. The light emitting display panel of claim 12, wherein a height of at least one of the first color filter, the second color filter, and the third color filter corresponds to a sum of a height of the first photochromic layer and a height of the second photochromic layer.

14. The light emitting display panel of claim 12, wherein a height of at least one of the first color filter, the second color filter, and the third color filter is larger than a sum of a height of the first photochromic layer and a height of the second photochromic layer.

15. The light emitting display panel of claim 11, wherein the first photochromic layer and the second photochromic layer are disposed in the non-emission area and surround each of the first emission area, the second emission area, and the third emission area.

16. The light emitting display panel of claim 15, wherein each the first photochromic layer and the second photochromic layer overlaps a portion of the first electrode in the non-emission area.

17. The light emitting display panel of claim 15, wherein a color pattern is further disposed in the non-emission area, and wherein the color pattern includes a first color pattern disposed on the encapsulation layer and a second color pattern disposed on the first color pattern.

18. The light emitting display panel of claim 17, wherein the first photochromic layer and the second photochromic layer are disposed between the color pattern and the first emission area, between the color pattern and the second emission area, and between the color pattern and the third emission area.

19. The light emitting display panel of claim 17, wherein a color of the first color pattern and a color of the second color pattern differ from each other and are selected from among red, green, and blue.

20. The light emitting display panel of claim 11, further comprising a fourth emission area, wherein a fourth color filter is disposed on the encapsulation layer, the fourth color filter having a height smaller than the height of each of the first color filter, the second color filter, and the third color filter.

21. The light emitting display panel of claim 6, wherein each of the plurality of color filters is laterally surrounded by the photochromic layer.

22. A light emitting display panel, comprising:
a first emission area, a second emission area, and a third emission area spaced apart from each other, wherein the first emission area, the second emission area and the third emission area, in operation, each emit a different color of light; and
a photochromic layer surrounding each of the first, second, and third emission areas and disposed in a non-emission area,
wherein when the first emission area, the second emission area, and the third emission area, individually or in combination, emit light, the photochromic layer is in a transparent state, and
wherein when light of a wavelength band shorter than visible light is incident on the photochromic layer, the photochromic layer is in an opaque state.

23. The light emitting display panel of claim 22, further comprising a color pattern disposed in the non-emission area except for an area in which the photochromic layer is disposed.

24. The light emitting display panel of claim 23, wherein one side surface of the photochromic layer is surrounded by the color pattern.

25. A light emitting display device, comprising:
a light emitting display panel including:
a substrate;

a first electrode disposed on the substrate;
a bank overlapping a portion of an upper surface of the first electrode;
a light emitting layer disposed on the first electrode;
a second electrode disposed on the light emitting layer;
an encapsulation layer disposed on the second electrode;
a photochromic layer disposed on the encapsulation layer, and overlapping a portion of the bank; and
a plurality of color filters disposed on the encapsulation layer and spaced apart from each other,
wherein when a first wavelength band of light is irradiated to the photochromic layer, the photochromic layer is in a transparent state,
wherein when a second wavelength band of light is irradiated to the photochromic layer, the photochromic layer is in an opaque state, the second wavelength band being shorter than the first wavelength band, and
wherein each of the plurality of color filters is laterally surrounded by the photochromic layer.

* * * * *